United States Patent
Crouch et al.

(10) Patent No.: US 9,089,863 B2
(45) Date of Patent: Jul. 28, 2015

(54) METHOD FOR CLEANING A NOZZLE OF A MATERIAL DEPOSITION SYSTEM

(75) Inventors: Kenneth C. Crouch, North Andover, MA (US); Robert W. Tracy, Haverhill, MA (US); Thomas J. Karlinski, Atkinson, NH (US); Scott A. Reid, Bradford, MA (US)

(73) Assignee: ILLINOIS TOOL WORKS INC., Glenview, IL (US)

( * ) Notice: Subject to any disclaimer, the term of this patent is extended or adjusted under 35 U.S.C. 154(b) by 692 days.

(21) Appl. No.: 13/448,724

(22) Filed: Apr. 17, 2012

(65) Prior Publication Data

US 2013/0269731 A1  Oct. 17, 2013

(51) Int. Cl.
| | |
|---|---|
| *B08B 9/00* | (2006.01) |
| *B05B 15/02* | (2006.01) |
| *B05C 11/10* | (2006.01) |
| *H05K 3/00* | (2006.01) |
| *B41J 2/165* | (2006.01) |
| *H05K 3/34* | (2006.01) |
| *H05K 3/12* | (2006.01) |

(52) U.S. Cl.
CPC ......... *B05B 15/0258* (2013.01); *B41J 2/16552* (2013.01); *B05C 11/1002* (2013.01); *B41J 2002/16555* (2013.01); *B41J 2202/02* (2013.01); *H05K 3/0091* (2013.01); *H05K 3/1225* (2013.01); *H05K 3/3484* (2013.01); *H05K 2203/013* (2013.01); *H05K 2203/0126* (2013.01); *H05K 2203/081* (2013.01)

(58) Field of Classification Search
None
See application file for complete search history.

(56) References Cited

U.S. PATENT DOCUMENTS

| | | | |
|---|---|---|---|
| 4,106,032 A | 8/1978 | Miura et al. | |
| 4,598,303 A | 7/1986 | Peekema et al. | |
| 4,613,875 A | 9/1986 | Le et al. | |
| 4,728,969 A | 3/1988 | Le et al. | |
| 5,819,983 A | 10/1998 | White et al. | |
| 7,294,309 B1 | 11/2007 | Goldberg et al. | |
| 7,980,197 B2 | 7/2011 | Prentice et al. | |
| 2007/0161135 A1 | 7/2007 | Keller et al. | |
| 2009/0115825 A1 | 5/2009 | Peng et al. | |
| 2012/0050410 A1 | 3/2012 | Kwok et al. | |

FOREIGN PATENT DOCUMENTS

| | | |
|---|---|---|
| JP | 2010 104863 A | 5/2010 |
| WO | 01/51217 A1 | 7/2001 |
| WO | 2012/027540 A1 | 3/2012 |

OTHER PUBLICATIONS

JPO machine translation of JP 2010-104863, retrieved from http://www19.ipdl.inpit.go.jp/PA1/cgi-bin/PA1DETAIL and http://www4.ipdl.inpit.go.jp/Tokujitu/PAJdetail.ipdl?N0000=60&N0120=01&N2001=2&N3001=2010-104863 on Feb. 21, 2015.*
Notification of Transmittal of the International Search Report and the Written Opinion of the International Searching Authority from corresponding PCT/US2013/036695 mailed Oct. 31, 2013.
Singapore Search Report from corresponding Singapore Application No. 11201406535U dated Apr. 8, 2015.
Singapore Written Opinion from corresponding Singapore Application No. 11201406535U dated Apr. 8, 2015.

* cited by examiner

*Primary Examiner* — Eric Golightly
(74) *Attorney, Agent, or Firm* — Lando & Anastasi, LLP

(57) ABSTRACT

A method for cleaning a nozzle of a material deposition system configured to deposit material on an electronic substrate includes: performing a deposition operation with a material deposition system configured to position an electronic substrate under a deposition head movable by a gantry, to supply material to a chamber of the deposition head, to extend a piston of the deposition head from the chamber, the needle terminating in a needle orifice, and to push a volume of material out of the chamber by an actuator of the deposition head to form a desired volume of material at the needle orifice that is deposited on the electronic substrate; and cleaning the needle orifice with air directed to the needle orifice.

6 Claims, 5 Drawing Sheets

METHOD FOR CLEANING A NOZZLE OF A MATERIAL DEPOSITION SYSTEM

BACKGROUND OF THE DISCLOSURE

1. Field of the Disclosure

This disclosure relates generally to systems and methods for depositing a material on a substrate, such as a printed circuit board, and more particularly to an apparatus and a method for depositing viscous materials, such as solder paste, epoxies, underfill materials, encapsulants, and other assembly materials, on electronic substrates.

2. Discussion of Related Art

There are several types of prior art dispensing systems used for dispensing metered amounts of liquid or paste for a variety of applications. One such application is the assembly of integrated circuit chips and other electronic components onto circuit board substrates, which are sometimes referred to as electronic substrates. In this application, automated dispensing systems are used for dispensing dots of liquid epoxy or solder paste, or some other related material, onto circuit boards. Automated dispensing systems are also used for dispensing lines of underfill materials and encapsulants, which mechanically secure components to the circuit board. Underfill materials and encapsulants are used to improve the mechanical and environmental characteristics of the assembly.

Another application is to dispense very small amounts or dots onto a circuit board. In one system capable of dispensing dots of material, a dispenser unit utilizes a rotating auger having a helical groove to force material out of a nozzle and onto a circuit board. One such system is disclosed in U.S. Pat. No. 5,819,983, entitled LIQUID DISPENSING SYSTEM WITH SEALING AUGERING SCREW AND METHOD FOR DISPENSING, which is owned by Speedline Technologies, Inc. of Franklin, Mass., a subsidiary of the assignee of the present disclosure.

In an operation employing an auger-type dispenser, the dispenser unit is lowered towards the surface of the circuit board prior to dispensing a dot or a line of material onto the circuit board and raised after dispensing the dot or line of material. Using this type of dispenser, small, precise quantities of material may be placed with great accuracy. The time required to lower and raise the dispenser unit in a direction normal to the circuit board, typically known as a z-axis movement, can contribute to the time required to perform dispensing operations. Specifically, with auger-type dispensers, prior to dispensing the dot or line of material, the dispenser unit is lowered so that the material touches or "wets" the circuit board. The process of wetting contributes to additional time to perform the dispensing operation.

It is also known in the field of automated dispensers to launch or jet dots of viscous material toward the circuit board. In such a jetter-type system, a minute, discrete quantity of viscous material is ejected from a nozzle with sufficient inertia to enable the material to separate from the nozzle prior to contacting the circuit board. As discussed above, with the auger-type application or other prior, traditional dispensing systems, it is necessary to wet the circuit board with the dot of material prior to releasing the dot from the nozzle. When ejecting, the dots may be deposited on the substrate without wetting as a pattern of discrete dots, or alternatively the dots may be placed sufficiently close to each other to cause them to coalesce into more or less a continuous pattern. One such jetter-type system is disclosed in U.S. Pat. No. 7,980,197, entitled METHOD AND APPARATUS FOR DISPENSING A VISCOUS MATERIAL ON A SUBSTRATE, which is owned by Illinois Tool Works Inc. of Glenview, Illinois, the assignee of the present disclosure.

In the field of micro-jetting technology, ink jet printers traditionally use one or more ink jet heads for precisely projecting drops of ink onto a printing medium (such as paper) to generate text, graphical images or other indicia. Drops are projected from a minute external orifice in each head to the printing medium so as to form the text, graphical images or other indicia on the printing medium. A suitable control system synchronizes the generation of ink drops. It is important that the ink drops be of substantially uniform size, and also that the drops are applied consistently onto the printing medium so that printing is not distorted. It is also important, especially when depositing material onto an electronic substrate, that the drops are applied precisely onto the electronic substrate.

Existing ink jet technology, whether it is thermal-jet or piezo-jet, can only jet micro-droplets with low viscosity liquids (typically 2-15 centipoise), such as water based inks, and only for short printing distances. Thus, traditional ink jet systems are not particularly suited for dispensing the more viscous materials described above. In such existing ink jet technology, a pressure pulse is applied to a fluid chamber with sufficient pressure to overcome surface tension forces, thereby forming and ejecting a droplet of fluid from the ink jet nozzle. However, for jetting higher viscosity liquids (greater than 100 centipoise) with drop-on-demand requirement, there is no known ink jetting method.

In one basic type of ink jet head, ink drops are produced on demand, for example as disclosed in U.S. Pat. No. 4,106,032, entitled APPARATUS FOR APPLYING LIQUID DROPLETS TO A SURFACE BY USING A HIGH SPEED LAMINAR AIR FLOW TO ACCELERATE THE SAME, the entire disclosure of which is herein incorporated by reference. In such drop-on-demand ink jet heads, ink in an ink chamber in the ink jet head, in response to a pressure wave generated from an electric pulse applied to a piezoelectric crystal, flows through an ink passageway in an ink chamber wall and forms an ink drop at an internal drop-forming orifice outlet located at the outer surface of the ink chamber wall. The ink drop passes from the drop-forming orifice outlet, through an air chamber, and toward a main external orifice of the ink jet head leading to the print medium. Continuous air under pressure is delivered to the air chamber and propels the ink drop through the air chamber and to the print medium.

However, such prior art drop-on-demand ink jet heads suffer from numerous disadvantages, drawbacks and/or limitations, for example as discussed in U.S. Pat. No. 4,613,875, entitled AIR ASSISTED INK JET HEAD WITH PROJECTING INTERNAL INK DROP-FORMING ORIFICE OUTLET, and in U.S. Pat. No. 4,728,969, entitled AIR ASSISTED INK JET HEAD WITH SINGLE COMPARTMENT INK CHAMBER, the entire disclosures of these patents are herein incorporated by reference. In an attempt to improve upon such prior art drop-on-demand ink jet heads, an ink chamber with an ink drop-forming orifice outlet from which ink drops are generated in response to pressure waves caused by a piezoelectric crystal. This internal orifice outlet is centered in a projecting structure which extends toward an external orifice. The projecting structure is of a frustoconical or mesa-like shape. As stated therein, air flowing past the top (orifice outlet) of the projection prevents ink from wetting anything but the top of the projection, resulting in highly uniform ink drop formation with a single uniform dot being produced on the printing medium in response to each pressure wave.

The existing micro-jetting technology, whether it is piezo-jet, positive displacement or time pressure has inherent limitations on droplet size and fluid viscosity range for suitable jetted fluids, and therefore have not been successfully incorporated into dispensers and systems for applying such viscous materials onto electronic substrates.

SUMMARY OF THE DISCLOSURE

One aspect of the disclosure is directed to a method for cleaning a nozzle of a material deposition system configured to deposit material on an electronic substrate. In one embodiment, the method comprises: performing a deposition operation with a material deposition system configured to position an electronic substrate under a deposition head movable by a gantry, to supply material to a chamber of the deposition head, to extend a piston of the deposition head from the chamber, the needle terminating in a needle orifice, and to push a volume of material out of the chamber by an actuator of the deposition head to form a desired volume of material at the needle orifice that is deposited on the electronic substrate; and cleaning the needle orifice with air directed to the needle orifice.

Embodiments of the method further may include positioning at least two air jets on opposite sides of the needle orifice and producing a pulse of air directed to the needle orifice. The method further may include synchronizing the timed pulse of air from the at least two air jets to clean the needle orifice. The material includes low viscosity and high viscosity materials. The micro-droplet is equal to or smaller than the needle orifice. The method further may include positioning the deposition head over a collection cup when cleaning the needle. The collection cup may be placed on a movable slide.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE DISCLOSURE

Figure 1:
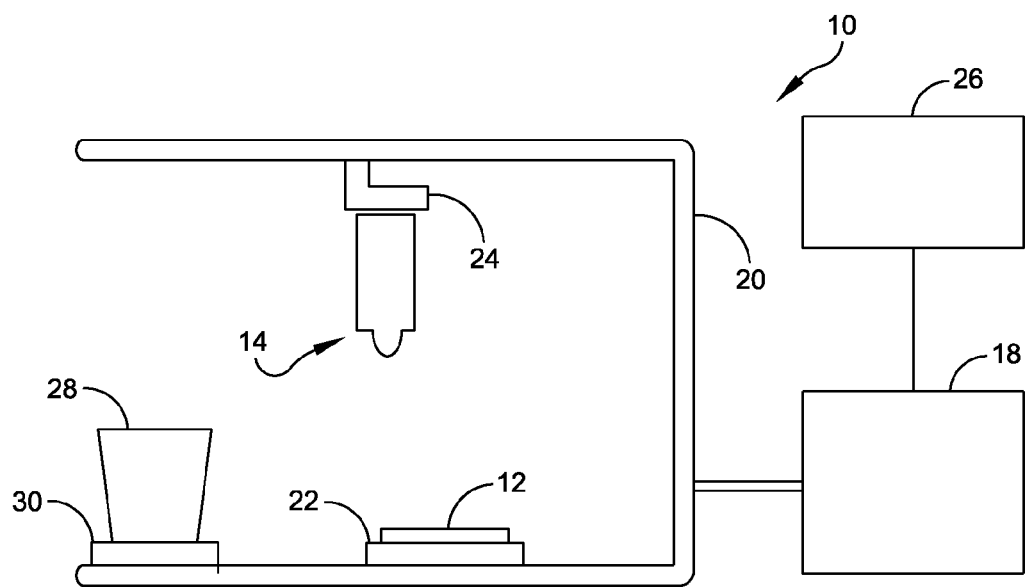
FIG. 1 is a side schematic view of a material deposition or application system.

For the purposes of illustration only, and not to limit the generality, the present disclosure will now be described in detail with reference to the accompanying figures. This disclosure is not limited in its application to the details of construction and the arrangement of components set forth in the following description or illustrated in the drawings. The principles set forth in this disclosure are capable of other embodiments and of being practiced or carried out in various ways. Also the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Various embodiments of the present disclosure are directed to material deposition or application systems, devices including such material deposition system, and methods of depositing material. Specifically, embodiments of the present disclosure are directed to dispensers used to dispense materials, such as semi-viscous and viscous materials, on an electronic substrate, such as a printed circuit board. Such materials include, and are not limited to, solder paste, epoxy, underfill materials, and encapsulants, all of which are used in the fabrication of printed circuit boards. Other less viscous materials, such as conductive inks, may also be used.

FIG. 1 schematically illustrates a material deposition system, such as a dispenser, generally indicated at 10, according to one embodiment of the present disclosure. The material deposition system 10 is used to deposit viscous materials (e.g., materials having greater than 100 centipoise) onto an electronic substrate 12, such as a printed circuit board or semiconductor wafer. Electronic substrate 12 further may include other substrates, such as solar cells. The material deposition system 10 may also be used to deposit other less viscous materials (semi-viscous materials), such as conductive inks, onto the electronic substrate 12. The material deposition system 10 may alternatively be used in other applications, such as for applying automotive gasketing material or in certain medical applications. It should be understood that references to less viscous, semi-viscous or viscous materials, as used herein, are exemplary and unless otherwise specified intended to be non-limiting.

The material deposition system 10 includes a deposition unit or head, sometimes referred to as a dispensing unit, which is generally indicated at 14, and a controller 18 to control the operation of the material deposition system. Although a single deposition head is shown, it should be understood that two or more deposition heads may be provided. The material deposition system 10 also includes a frame 20 having a base 22 for supporting the substrate 12, and a gantry system 24 movably coupled to the frame 20 for supporting and moving the deposition head 14. The deposition head 14 and the gantry system 24 are coupled to the controller 18 and operate under the direction of the controller. A conveyor system (not shown) or other transfer mechanism, such as a walking beam, may be used in the material deposition system 10 to control loading and unloading of circuit boards to and from the material deposition system. The gantry system 24 can be moved using motors under the control of the controller 18 to position the deposition unit 14 at predetermined locations over the circuit board.

The material deposition system 10 may optionally include a display unit 26 connected to the controller 18 for displaying various information to a user. In another embodiment, there may be an optional second controller for controlling the deposition unit. The material deposition system 10 further includes a collection cup 28 when cleaning the needle, which will be described in greater detail below. As shown, the collection cup 28 is placed on a movable slide 30, which is movable relative to the frame 20.

Figure 2:
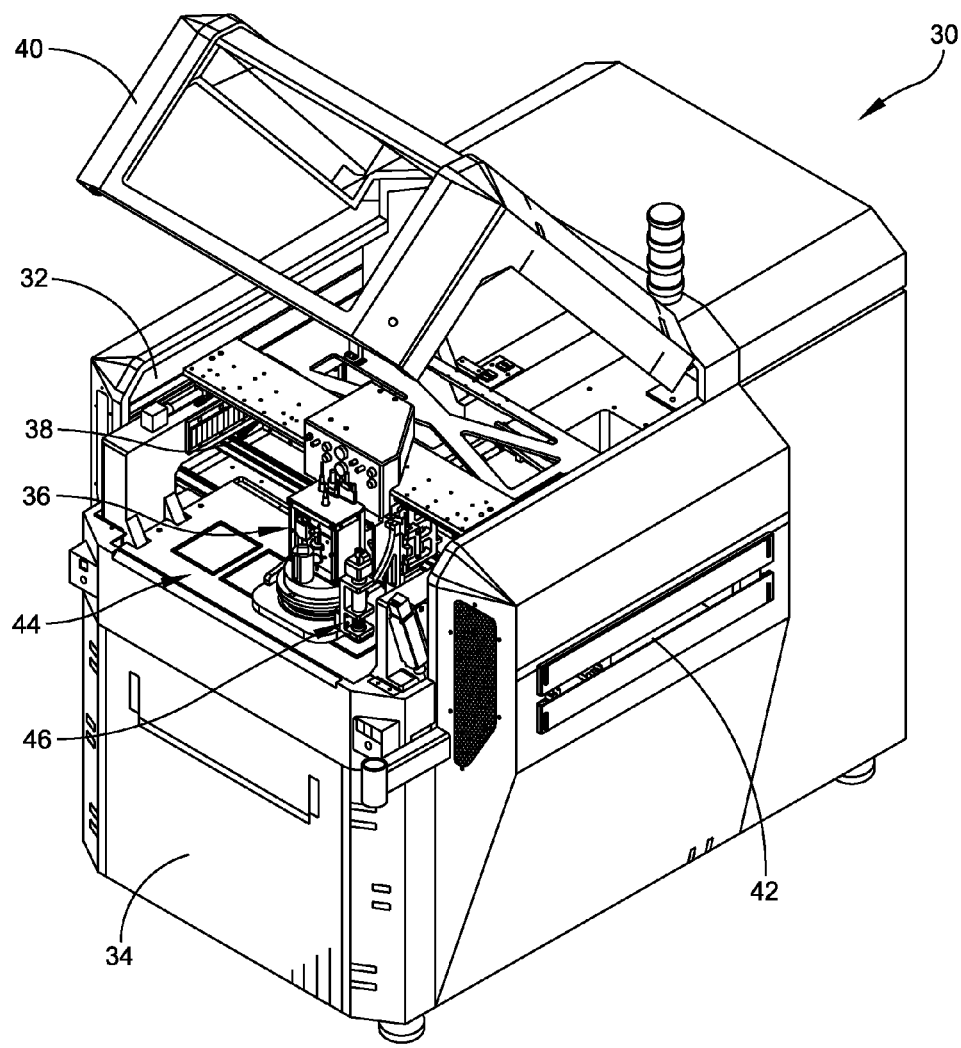
FIG. 2 is a perspective view of an exemplary material deposition system embodying a gantry system and a material deposition head of an embodiment of the present disclosure.

Referring to FIG. 2, an exemplary material deposition system, generally indicated at 30, may be configured from a XYFLEXPRO® dispenser platform offered by Speedline Technologies, Inc. of Franklin, Mass. The material deposition system 30 includes a frame 32 that supports components of the material deposition system, including but not limited to a controller, such as controller 18, which is located in a cabinet 34 of the material deposition system, and a deposition or dispensing head, generally indicated at 36, for depositing low viscous materials (e.g., less than 50 centipoise), semi-viscous materials (e.g., 50-100 centipoise), viscous materials (e.g., 100-1000 centipoise), and/or high viscous materials (e.g., greater than 1000 centipoise). The deposition head 36 may be movable along orthogonal axes by a gantry system, generally indicated at 38, under the control of the controller 18 to allow dispensing of the material on the circuit board, such as substrate 12, which, as mentioned above, may sometimes be referred to as an electronic substrate or a circuit board. A cover 40 is shown in an open position to reveal the internal components of the material deposition system 30, including the deposition head 36 and the gantry system 38.

Circuit boards, such as substrates 12, that are fed into the material deposition system 30, typically have a pattern of pads or other, usually conductive surface areas onto which material will be deposited. The material deposition system 30 also includes a conveyor system (not shown) that is accessible through an opening 42 provided along each side of the material deposition system to transport the circuit board in an x-axis direction to a depositing position in the material deposition system. In some implementations, the material deposition system 30 has a peripheral station assembly, generally indicated at 44, positioned adjacent to the circuit board when the circuit board is in the depositing position under the deposition head 36. When directed by the controller of the material deposition system 30, the conveyor system supplies circuit boards to a location adjacent to the peripheral station assembly 44 and under the deposition head 36. Once arriving at the position under the deposition head 36, the circuit board is in place for a manufacturing operation, e.g., a deposition operation.

The material deposition system 30 further includes a vision inspection system, generally indicated at 46, that is configured to align the circuit board and to and inspect the material deposited on the circuit board. To successfully deposit material on the circuit board, the circuit board and the deposition head 36 are aligned, via the controller 18. Alignment is accomplished by moving the deposition head 36 and/or the circuit board based on readings from the vision inspection system 46. When the deposition head 36 and the circuit board are aligned correctly, the deposition head is manipulated to perform a deposition operation. After the deposition operation, optional inspection of the circuit board by means of the vision inspection system 46 may be performed to ensure that the proper amount of material has been deposited and that the material has been deposited at the proper locations on the circuit board. The vision inspection system 46 can use fiducials, chips, board apertures, chip edges, or other recognizable patterns on the circuit board to determine proper alignment. After inspection of the circuit board, the controller controls movement of the circuit board to the next location using the conveyor system, where a next operation in the board assembly process may be performed, for example electrical components may be placed on the circuit board or the materials deposited on the board may be cured.

In some embodiments, the material deposition system 30 may operate as follows. The circuit board may be loaded into the material deposition system 30 in a depositing position using the conveyor system. The circuit board is aligned with the deposition head 36 by using the vision inspection system 46. The deposition head 36 may then be initiated by the controller to perform a deposit operation in which material is deposited at precise locations on the circuit board. Once the deposition head 36 has performed a depositing operation, the circuit board may be transported by the conveyor system from the material deposition system 30 so that a second, subsequent circuit board may be loaded into the material deposition system.

Figure 3A:
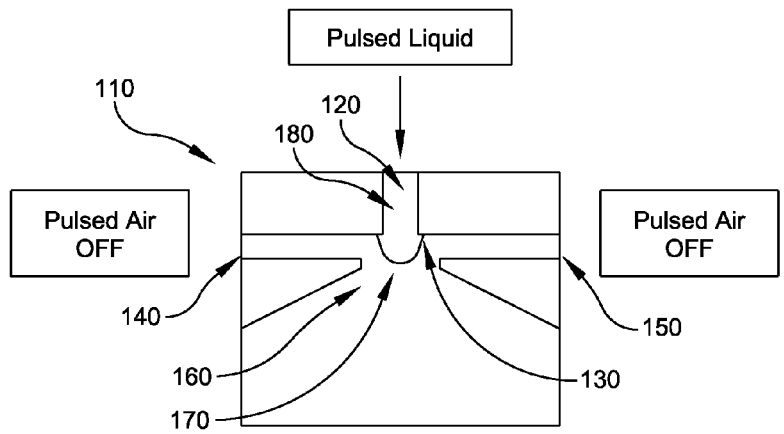
FIGS. 3A, 3B, 3C and 3D are schematic depictions of the formation of a micro-droplet by the method and system of the present disclosure.
Figure 3B:
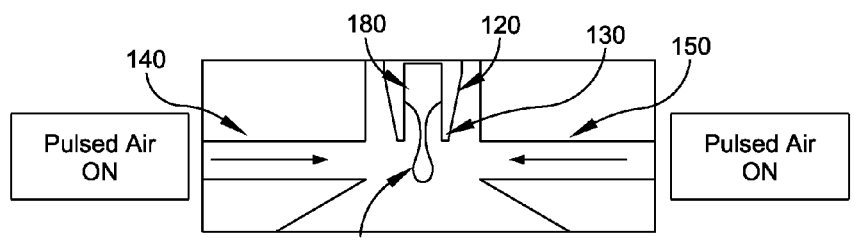
Figure 3C:
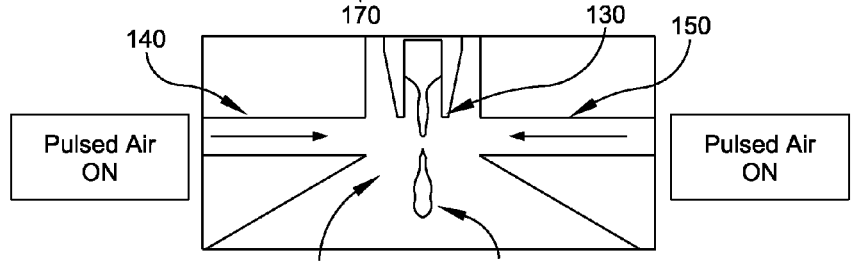
Figure 3D:
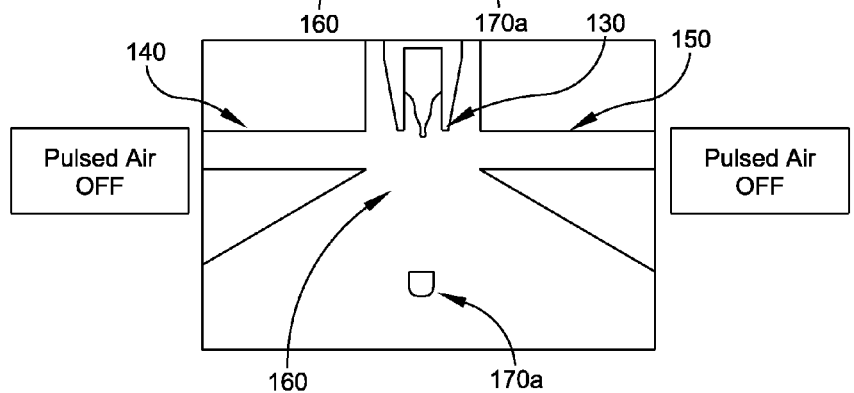

Referring to FIGS. 3A-3D, FIG. 3A illustrates a deposition head embodying an ink jet head of an ink jet system 110 of the present disclosure. Although "ink" and "ink jet" are used herein to describe the ink jet system 110, it should be understood that "ink" and "ink jet" should not be limiting as to the systems and materials deposited by the systems. As shown in FIG. 3A, the deposition head has an initial formation of a desired volume of material at the orifice outlet of a needle, and the beginning of the timed pulse of air from air jets. FIG. 3B illustrates the initial formation of the micro-droplet by the pulsed air from the air jets. FIG. 3C illustrates the breaking away of the micro-droplet from the supply of ink and the orifice outlet of the needle, and the acceleration of the micro-droplet toward the printing medium. FIG. 3D illustrates the completed micro-droplet exiting the external orifice of the ink jet head, and the ending of the timed pulse of air.

Accordingly, FIGS. 3A-3D illustrate schematically a cross-sectional view of the ink drop-forming portion of the exemplary ink jet head of the system 110 of the present disclosure. As can be seen, the end of a needle 120 terminates in an orifice outlet 130. A first air jet 140 and a second air jet 150 are positioned at opposite sides of the orifice outlet 30 for directing a timed pulse of air at the orifice outlet 130. An external orifice 160 of the exemplary ink jet head is located under the orifice outlet 130 of needle 120. The external orifice 160 is axially aligned with the needle 120 and its orifice outlet 130.

Turning now to FIG. 3A, an initial formation of the desired volume 170 of ink 180 is formed at the orifice outlet 130 of the needle 120 by a suitable actuator, such as a piezoelectric crystal, a piston, or any other suitable actuator capable of pulsing the ink from an ink chamber into and through the needle 120. The actuator force need not be sufficient to fully eject a droplet from the needle outlet. The desired volume 170 is depicted as the generally semi-spherical projection of ink extending out from the orifice outlet 130 of the needle 120. Prior to or simultaneously with the formation of the desired volume 170, the first air jet 140 and the second air jet 150 are activated in concert to deliver a timed pulse of air at the desired volume 170.

As a result, the force of the pulsed air from the air jets 140 and 150 squeezes the desired volume 170, as illustrated in FIG. 3B, until the desired volume 170 breaks free from the remainder of the ink 180 in the needle 120, as illustrated in FIG. 3C, thus creating the micro-droplet 170a. As illustrated in FIG. 3C, the force from of the pulsed air from the air jets 140 and 150 continues to accelerate the micro-droplet 170a out of the external orifice 160 and towards the printing medium.

Once the micro-droplet 170a is formed and propelled out of the external orifice 160, the air jets 140 and 150 are deactivated, as illustrated in FIG. 3D. By utilizing a timed pulse of air to create and accelerate the micro-droplet 170a using the method described above, a micro-droplet smaller than the diameter of the orifice outlet 130 can be created and accelerated at a high enough velocity for proper jetting, and at longer print distances. This is true even for high viscosity liquids.

Ending the timed pulse of air at the time illustrated in FIG. 3D ensures that the micro-droplet 170a will maintain its integrity as it travels to the printing medium at high velocity. A continuous high velocity air flow will shear the ink drop, produce long "tails" of ink trailing the ink drop, or otherwise adversely affect the integrity of the ink drop and result in improper or otherwise flawed application to the printing medium.

Figure 4:
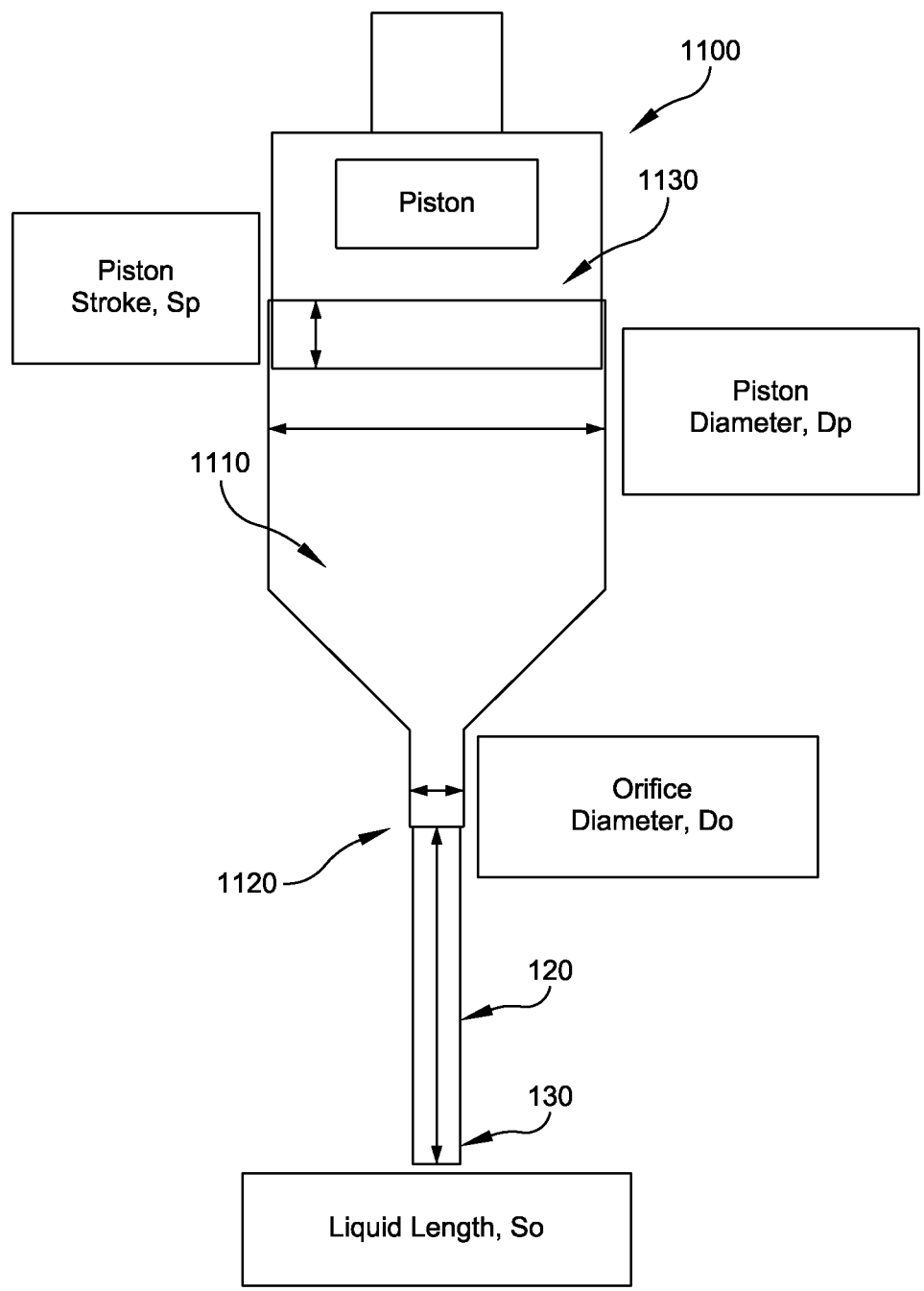
FIG. 4 is a schematic depiction of an exemplary embodiment of the needle extending from an ink chamber, and an actuator used to expose the desire volume of ink at the orifice outlet of the needle.

Referring now to FIG. 4, an exemplary embodiment of the disclosed method and system is illustrated. A piston housing 1100 is illustrated having an ink chamber 1110 terminating in a piston housing orifice 1120 having a diameter $D_o$. A needle 120 is suitably attached to the piston housing orifice 1120. The needle 120 having the same or substantially the same diameter as the piston housing orifice $D_o$. The needle 120 further defines a length or liquid length $S_o$. A piston 1130 is operatively positioned inside the piston housing 1100 and is moveable therein at a piston stroke distance of $S_p$. The piston 1130 has a piston diameter of $D_p$. It should be understood that the piston 1130 is moved via a suitable piston control system which actuates the piston 1130 on demand, wherein the piston 1130 travels the piston stroke distance $S_p$ to push a desired volume of ink out of the ink chamber 1110, into and through the needle 120 and out of the needle orifice outlet 130, as illustrated in FIG. 3A.

While the actuator in FIG. 4 is illustrated as a piston 1130, it should be understood that any suitable actuator may be used to push a desired volume of ink out of the needle 120 as shown in FIG. 3A. For example, a piezoelectric crystal may be used instead of a piston.

Numerous factors affect the size of the ink drop, i.e. droplet diameter, and the jetting of the ink drop to the print medium. Such factors include acceleration time $\Delta_t$, orifice area $A_o$, piston area $A_p$, piston acceleration ap, orifice diameter $D_o$, piston diameter $D_p$, force on piston $F_p$, piston mass $M_p$, liquid column length $S_o$, piston stroke $S_p$, average liquid velocity $U_o$, liquid final velocity at orifice $U_{o,f}$, liquid initial velocity at orifice $U_{o,i}$, average piston velocity $U_p$, piston final velocity $U_{p,f}$, piston initial velocity $U_{p,i}$, liquid density $\rho$, and surface tension $\sigma$. In accordance with the presently disclosed method and system, it has been determined that the size of the ink drop, or more specifically the diameter of the droplet $D_d$, can be calculated using the following equation:

$$D_d = \left(\frac{6\sigma}{\rho}\frac{M_p}{F_p}\frac{D_o^3}{D_p^2}\right)^{\frac{1}{3}} = \left(\frac{6\sigma}{\rho}\frac{M_p}{F_p}\frac{S_p D_o}{S_o}\right)^{\frac{1}{3}}$$

It can thus be seen that droplet volume is proportional to the ratio of surface tension to liquid density. Droplet volume is inversely proportional to acceleration. Droplet volume is proportional to the ratio of the cube root of the orifice diameter or $D_{o3}$ to the square root of the piston diameter or $D_{p2}$. It can also be seen that higher acceleration produces smaller droplet volume. To get higher acceleration, a longer stroke length is generally needed, otherwise a huge amount of energy must be supplied. However, a longer stroke generates a larger droplet volume. To get small droplet volume, a short stroke must be used, but then high acceleration cannot typically be obtained. The present method and system, however, is able to use a short stroke to produce a small droplet volume, while simultaneously achieving high droplet velocity.

In the presently disclosed method and system, only a micro-volume of ink is needed to be present at the needle orifice outlet, and the timed pulse of air from the air jets is used to extract the micro-volume. The timed pulse of air from the air jets is able to accelerate the droplet up to 340 m/s (sound velocity). Accordingly, the timed pulse of air from the air jets supplies the energy needed to extract the micro-droplets from high viscosity liquids and accelerate them to high velocities. The timed pulse of air also keeps the orifice clean, keeps the drop straight as it travels to the print medium, and adds extra detachment force.

By way of example, the embodiment illustrated in FIG. 4 was used to jet micro-droplets of 30 W Motor Oil. In this example, the orifice diameter Do was 152 μm and the piston diameter $D_p$ was 850 μm. Using a piston stroke $S_p$ of 100 μm, the timed pulse of air from the air jets produced and accelerated at high velocity micro-droplets having a diameter $D_d$ less than the orifice diameter $D_o$. While the above stated dimensions are illustrative of the operation of the exemplary method and system, it should be understood that various modifications may be made to these dimensions with departing from the teachings herein.

While the foregoing discussion presents the teachings in an exemplary fashion with respect to the disclosed method and system for pulsed air-actuated, high velocity micro-droplets on demand for high viscosity liquids, it will be apparent to those skilled in the art that the teachings may apply to any type of device that produces and applies droplets of liquid to a substrate (e.g., painting, soldering, printing, etc.). Further, while the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein.

In one example, with reference to FIGS. 5A-5E, a nozzle or needle is generally indicated at 2000. As shown, in one embodiment illustrated in 5A and 5B, the needle 2000 includes three parts, which, when mated together, form a plurality of air passages that exit circumferentially about the fluid dispense needle orifice. The passages force the air to flow uniformly and parallel to the ejected fluid stream. The open area of the passages is reduced uniformly as the air flows through, increasing its velocity significantly. This high velocity flow causes any liquid, which is attached to the needle orifice exterior by surface tension to become detached from the needle exterior and be carried away by the airflow.

Figure 5A:
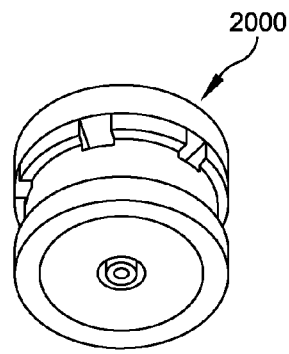
FIG. 5A is a perspective view showing a needle of an embodiment of the present disclosure.
Figure 5B:
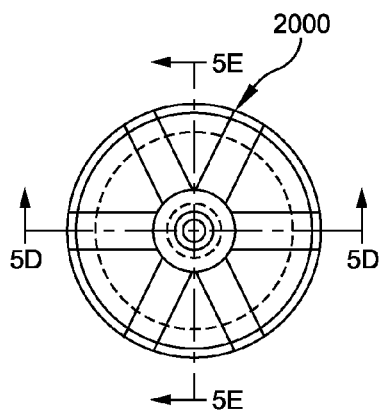
FIG. 5B is a top view thereof.
Figure 5C:
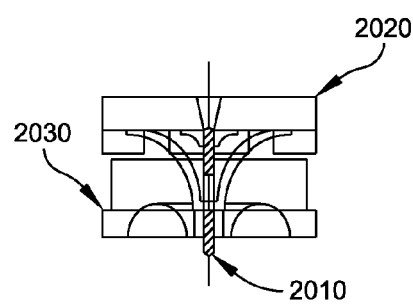
FIG. 5C is a side view thereof.

The three parts of the needle are shown in FIG. 5C, and include a fluid dispensing needle 2010, a seat 2020, which mates with a fluid pumping device to form a closure for liquid and air assist passages to keep flows separate and shape the direction of the air assist flow into a flow parallel and concentric with the fluid flow, and a nozzle 2030, which forces the flow to be concentric with the dispensed liquid stream, and also forms a passage for stabilizing and containing the air assist flow.

Figure 5D:
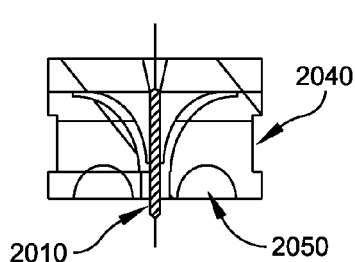
FIG. 5D is a cross-sectional view taken along line 5D-5D in FIG. 5B.

FIG. 5D illustrates an air assist inlet port 2040, which distributes the airflow circumferentially about the air assist flow directional ports to equalize flow. The air assist flow exiting concentric to the dispense needle 2010, and an indented face 2050 of the needle, which serves to further shape the airflow and direct any liquid splashes away from the needle discharge tip.

Figure 5E:
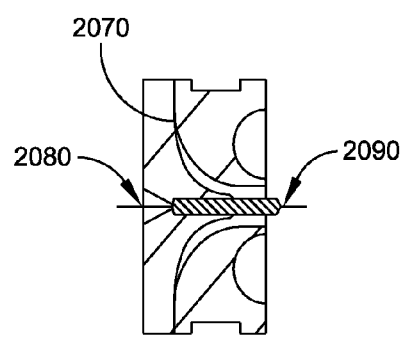
FIG. 5E is a cross-sectional view taken along line 5E-5E in FIG. 5B.

FIG. 5E illustrates a fluid inlet port 2080, a dispense needle exit port 2090, and one of the air assist flow directional ports 2070.

The arrangement is such that the air assist air flowing through the directional control passages and exiting about the dispensing needle outlet generates a "Venturi effect," which creates a negative pressure at the very tip of the dispensing needle and draws away any remaining fluid which may be left at the tip. This fluid is carried away by the air assist stream and can be collected in a waste container cup for disposal.

A method for cleaning a needle or nozzle of a material deposition system, such as a dispenser, is further disclosed. The method includes performing a deposition operation with a material deposition system, such as system 10 or 30, which is configured to position an electronic substrate under a deposition head movable by a gantry, to supply material to a chamber of the deposition head, to extend a piston of the deposition head from the chamber, and to push a volume of material out of the chamber by an actuator of the deposition head to form a desired volume of material at the needle orifice that is deposited on the electronic substrate. The method further includes cleaning the needle orifice with air directed to the needle orifice. The step of cleaning the needle orifice may be performed prior to or after the deposition operation. The cleaning step includes positioning two or more air jets on opposite sides of the needle orifice and producing a pulse of air directed to the needle orifice. In a certain embodiment a control system is synchronized to produce the timed pulse of air from the two air jets to clean the needle orifice. In another embodiment, the method further includes positioning the deposition head over a collection cup when cleaning the needle. The collection cup is placed on a movable slide to move or position the collection cup under the deposition head.

Thus, it should be observed that the dispensing head of embodiments of the present disclosure utilizes air as an actuating energy to assist in the release of droplets from the dispensing head. A small device is fitted in close proximity to the nozzle exit and concentric to it in order to produce a shear force to detach the droplet from the surface of the nozzle. The device is configured to cause the air to impinge on the nozzle at or very near the point of exit of the fluid and is balanced geometrically about the nozzle to avoid any windage or force which would cause the droplet to veer off its intended course during flight to the dispensing surface. The effect of the air assist can be varied by changing applied pressure and can also be implemented in a pulsed mode to further disrupt the surface tension between the droplet and the nozzle. If applied in pulsed mode, it is very important to time the pulse and duration in order to ensure efficient detachment and utilize the residual airflow exiting the device to assist in carrying the droplets toward the target.

In certain embodiments, the timed pulse directed perpendicular to the droplet direction to permit significant decrease in the droplet size. In one embodiment, the air assist should not be initiated too soon before the droplet is ejected or the turbulence created may interfere with the ejection of the small droplets. Further, the air assist should not be applied too late or the desired release may not occur and the droplet will not leave the nozzle. The pulse of air may be short enough so that there will not be residual pressure present to interfere with the ejection of successive droplets.

The teachings of the present disclosure may be applied to any type of dispensing system, including dispensing systems having jetter-type dispensing heads, to jet material onto the electronic substrate.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method for cleaning a nozzle of a material deposition system configured to deposit material on an electronic substrate, the method comprising:

performing a deposition operation with a material deposition system configured to position an electronic substrate under a deposition head movable by a gantry, to supply material to a chamber of the deposition head, to extend a piston of the deposition head from the chamber, the deposition head having a needle terminating in a needle orifice, and to push a volume of material out of the chamber by an actuator of the deposition head to form a desired volume of material at the needle orifice that is deposited on the electronic substrate; and cleaning the needle orifice with air directed to the needle orifice, wherein cleaning the needle orifice includes positioning at least two air jets on opposite sides of the needle orifice and producing a pulse of air directed to the needle orifice.

2. The method of claim 1, further comprising synchronizing the timed pulse of air from the at least two air jets to clean the needle orifice.

3. The method of claim 1, wherein the material includes low viscosity and high viscosity materials.

4. The method of claim 3, wherein a micro-droplet dispensed through the needle orifice is equal to or smaller than the needle orifice.

5. A method for cleaning a nozzle of a material deposition system configured to deposit material on an electronic substrate, the method comprising:

performing a deposition operation with a material deposition system configured to position an electronic substrate under a deposition head movable by a gantry, to supply material to a chamber of the deposition head, to extend a piston of the deposition head from the chamber, the deposition head having a needle terminating in a needle orifice, and to push a volume of material out of the chamber by an actuator of the deposition head to form a desired volume of material at the needle orifice that is deposited on the electronic substrate;

cleaning the needle orifice with air directed to the needle orifice; and positioning the deposition head over a collection cup when cleaning the needle.

6. The method of claim 5, wherein the collection cup is placed on a movable slide.

* * * * *